United States Patent [19]

Brock et al.

[11] Patent Number: 4,649,024

[45] Date of Patent: * Mar. 10, 1987

[54] METHOD FOR FORMING EVAPORATED PNICTIDE AND ALKALI METAL POLYPNICTIDE FILMS

[75] Inventors: David G. Brock, Mt. Kisco; John A. Baumann, Ossining, both of N.Y.

[73] Assignee: Stauffer Chemical Company, Westport, Conn.

[*] Notice: The portion of the term of this patent subsequent to Jun. 24, 2003 has been disclaimed.

[21] Appl. No.: 581,139

[22] Filed: Feb. 17, 1984

Related U.S. Application Data

[63] Continuation-in-part of Ser. No. 509,159, Jun. 29, 1983.

[51] Int. Cl.$^4$ .............................................. B05D 5/12
[52] U.S. Cl. ........................................ 427/82; 427/85; 427/86; 427/87; 427/166; 427/248.1; 427/250; 427/255; 427/255.2
[58] Field of Search ................... 427/248.1, 255, 255.1, 427/255.2, 250, 82, 87, 85, 86, 109, 166, 164, 70, 314, 91

[56] References Cited

U.S. PATENT DOCUMENTS

| | | | |
|---|---|---|---|
| 2,656,287 | 10/1953 | Longini | 427/248.1 |
| 2,803,569 | 8/1957 | Jacobs et al. | 427/250 |
| 3,082,124 | 3/1963 | French et al. | 427/250 |
| 3,607,135 | 9/1971 | Gereth | 427/250 |
| 4,006,268 | 2/1977 | Kennedy et al. | 427/248.1 |
| 4,145,314 | 3/1979 | Fung et al. | 502/213 |
| 4,150,065 | 4/1979 | Harris et al. | 260/683.2 |
| 4,195,891 | 4/1980 | Hellier | 316/5 |
| 4,239,584 | 12/1980 | Chang et al. | 427/250 |
| 4,359,406 | 11/1982 | Fung | 502/200 |
| 4,454,246 | 6/1984 | Fung | 502/213 |

FOREIGN PATENT DOCUMENTS

| | | | |
|---|---|---|---|
| 143705 | 9/1880 | Fed. Rep. of Germany | 423/322 |
| 51-20784 | 2/1976 | Japan | 427/248.1 |

OTHER PUBLICATIONS

Alfa Products "Alfa's 1981 Surplus Stock Sale—Graphimets-Graphite Intercalates" *Thiokol/Ventron Division Alfa Products,* pp. 2A–5A, 1981.

Kirk–Othmer, *Encyclopedia of Chemical Technology,* Third Edition, vol. 4, John Wiley & Sons, p. 696.

"Comprehensive Inorganic Chemistry" *Pergamon Press,* pp. 1271–1278, 1973.

G. R. Hennig, "Some Experimental Observations in the Caesium–Graphite System" Interstitial Compounds of Graphite in Progress in Inorganic Chemistry, 1, 1959.

N. N. Greenwood & A. Earnshaw, "Graphite Intercalation Compounds", *Chemistry of the Elements,* Pergamon Press Ltd., pp. 313–314, 1984.

H. W. Melville and S. C. Gray, "The Polymerisation of Phosphorus", *Trans. Faraday Soc.* 32 271 (1936).

*Primary Examiner*—Sadie L. Childs
*Attorney, Agent, or Firm*—F. Eugene Davis, IV; Mark P. Stone

[57] ABSTRACT

A method and apparatus are provided for producing fine quality pnictide films by vacuum evaporation and molecular beam deposition. A pnictide source, preferably phosphorous, is heated to produce a continuous supply of vapor species, preferably $P_4$. The vapor species is cracked by a heated tungsten wire positioned adjacent the pnictide source to produce $P_2$ molecules. A second tungsten wire cracker is located adjacent a substrate to prevent the recombination of $P_2$ molecules into $P_4$ molecules. The $P_2$ molecules are deposited on the substrate and condense into amorphous pure phosphorous shiny red films. A separate source of alkali metal intercalate, preferably $KC_8$, may also be heated to provide an alkali metal vapor for producing films of alkali metal polypnictide films, preferably $KP_x$ where x is equal to or greater than 15, to be deposited on the substrate. Fine quality films may also be deposited on a substrate by a molecular beam apparatus providing a continuous source of pnictide vapor species and a cracker disposed between the exit of a pnictide collimator and the substrate.

14 Claims, 3 Drawing Figures

4,649,024

METHOD FOR FORMING EVAPORATED PNICTIDE AND ALKALI METAL POLYPNICTIDE FILMS

RELATED APPLICATIONS

This application is a continuation-in-part of U.S. patent application entitled VACUUM EVAPORATED FILMS OF CATENATED PHOSPHORUS MATERIAL, Ser. No. 509,159, filed June 29, 1983; which application is incorporated herein by reference.

This application is related to the following co-pending applications, assigned to the same assignee as this application. These applications are incorporated herein by reference. U.S. patent application entitled CATENATED SEMICONDUCTOR MATERIALS OF PHOSPHORUS, METHODS AND APPARATUS FOR PREPARING AND DEVICES USING THEM, Ser. No. 335,706, filed Dec. 30, 1981, now abandoned; MONOCLINIC PHOSPHORUS FORMED FROM VAPOR IN THE PRESENCE OF AN ALKALI METAL, Ser. No. 419,537, filed Sept. 17, 1982 which is a continuation-in-part of Ser No. 335,706; CATENATED PHOSPHORUS MATERIALS, THEIR PREPARATION AND USE, AND SEMICONDUCTOR AND OTHER DEVICES EMPLOYING THEM, Ser. No. 442,208, filed Nov. 16, 1982 (now U.S. Pat. No. 4,508,931), which is a continuation-in-part of Ser. Nos. 335,706 and 419,537; GRAPHITE INTERCALATED ALKALI METAL VAPOR SOURCES, Ser. No. 509,157, filed June 29, 1983; SPUTTERED SEMICONDUCTING FILMS OF CATENATED PHOSPHORUS MATERIAL AND DEVICES FORMED THEREFROM, Ser. No. 509,175, filed June 29, 1983 (now U.S. Pat. No. 4,509,066); MIS DEVICES EMPLOYING ELEMENTAL PNICTIDE OR POLYPHOSPHIDE INSULATING LAYERS, Ser. No. 509,210, June 29, 1983; and, LIQUID PHASE GROWTH OF CRYSTALLINE POLYPHOSPHIDE, Ser. No. 509,158, filed June 29, 1983; also, the applications filed herewith of Diego J. Olego, John A. Baumann, Paul M. Raccah, Rozalie Schachter, Harvey B. Serreze and William E. Spicer for PASSIVATION AND INSULATION OR III-V DEVICES WITH PNICTIDES, PARTICULARLY AMORPHOUS PNICTIDES HAVING A LAYER-LIKE STRUCTURE, Ser. No. 581,115, filed Feb. 17, 1984; Diego J. Olego for PNICTIDE BARRIERS IN QUANTUM WELL DEVICES, Ser. No. 581,140, filed Feb. 17, 1984; Diego J. Olego for USE OF PNICTIDE FILMS FOR WAVE-GUIDING IN OPTOELECTRONIC DEVICES, Ser. No. 581,171, filed Feb. 17, 1984; Rozalie Schachter and Marcello Viscogliosi for VACUUM DEPOSITION PROCESSES EMPLOYING A CONTINUOUS PNICTIDE DELIVERY SYSTEM, PARTICULARLY SUPPTERING, Ser. No. 581,103, filed Feb. 17, 1984; Mark A. Kuck and Susan W. Gersten for CONTINUOUS PNICTIDE SOURCE AND DELIVERY SYSTEM FOR FILM DEPOSITION, PARTICULARLY BY CHEMICAL VAPOR DEPOSITION, Ser. No. 581,102, filed Feb. 17, 1984; Mark A. Kuck and Susan W. Gersten for METHOD OF PREPARING HIGH PURITY WHITE PHOSPHORUS, Ser. No. 581,105, filed Feb. 17, 1984; Robert Parry, John A. Baumann and Rozalie Schachter for PNICTIDE TRAP FOR VACUUM SYSTEMS, Ser. No. 581,101, filed Feb. 17, 1984; and, Mark A. Kuck, Susan W. Gersten, John A. Baumann and Paul M. Raccah for HIGH VACUUM DEPOSITION PROCESSES EMPLOYING A CONTINUOUS PNICTIDE DELIVERY SYSTEM Ser. No. 581,104, filed Feb. 17, 1984.

TECHNICAL FIELD

This invention relates to a thermal cracker for forming pnictide films in high vacuum processes. More particularly, it relates to production of such films in a vacuum evaporator utilizing separately heated sources for the elements to be deposited. Superheated tungsten crackers are employed at the phosphorus source and below the substrates to ensure that only the Pnictide$_2$ species, not the Pnictide$_4$ species, reaches the substrates. The products produced include a pure phosphorus semiconducting amorphous film having an optical band edge at 2.0 eV, insulating films for MIS devices on III-V semiconductors and catenated phosphorus semiconductors of the formula MP$_x$ where x ranges from 15 to infinity. The invention also relates to the modification of such films by the incorporation of co-evaporated metal and to the manufacture of electronic semiconductor devices, electro-optical devices, thin films, optical films and coatings.

The invention further relates to the employment of a thermal cracker in molecular beam epitaxy to convert Pnictide$_4$ to Pnictide$_2$. Fine quality, pure phosphorus films have been produced for passivation and insulation of III-V semiconductors and for other uses.

BACKGROUND ART

The above-identified, previously filed, co-pending applications disclose semiconductors formed of catenated phosphorus materials. It is highly desirable that uniform thin films of these materials be formed on a variety of substrates for use in electronic and electro-optical devices, as optical films, coatings and the like. It is further highly desirable that an easy and convenient method be found to reduce the intrinsic resistivity of these materials.

The above-identified application filed herewith and U.S. patent application entitled MIS DEVICES EMPLOYING ELEMENTAL PNICTIDE OR POLYPHOSPHIDE INSULATING LAYERS, Ser. No. 509,210, filed June 29, 1983, relate to the insulation and passivation of III-V semiconductors and a new amorphous thin film form of phosphorus. Apparatus and methods for efficiently producing these films are highly desirable.

DISCLOSURE OF THE INVENTION

We have produced high quality thin films of polyphosphides, for example KP$_{15}$ and KP$_x$, where x is greater than 15, by a novel vacuum co-evaporation process. This process has produced fine quality films having surface irregularities no greater than approximately 20 Angstroms. It offers the ability to easily change the stoichiometery of the depositing film at any point during a deposition.

The process also provides the ability to form pure phosphorus amorphous films which may be especially useful to insulate and passivate III-V semiconductors.

The vacuum evaporations are performed in a Cooke high vacuum evaporator model CVE-301. This apparatus has a 12″ stainless steel bell jar and a diffusion pump system with a base pressure of less than $10^{-6}$ torr. The system schematic is shown in the drawing. The bell jar 20 is pumped through outlet 22. Substrates 28, which have included glass, silicon, gallium phosphide, gallium arsenide, and indium phosphide are radiantly heated to temperatures between 25° C. and 325° C. and exposed to the upwardly directed vapor streams through openings in their support 31 (not shown). Baffled sources 24 and 26 obtained from R. D. Mathis are used for the phosphorus and the potassium respectively. They are resistively heated, boats made from molybdenum or tantalum. The potassium source may be elemental potassium or preferably a graphite intercalate such as $KC_8$, as disclosed in the co-pending U.S. patent application of Gary K. Miller, John A. Bauman, David G. Brock and Mark A. Kuck relating to Graphite Intercalated Alkali Metal Vapor Sources, Ser. No. 509,157, filed June 29, 1983, which application is incorporated herein by reference, the phosphorus is cracked from $P_4$ to $P_2$ by two high temperature tungsten filaments heated to greater than 1000° C. The first 32 is located in the vapor stream emerging from the source 24, and the other 34 is located just below the substrates 28. The use of the cracker 34 at the substrates 28 is critical in that it prevents the reformation of $P_4$ molecules which reduces the efficiency of the process.

The phosphorus source which contains red phosphorus is resistively heated to 300°-700° C. and the potassium source is heated to 100°-400° C. by high current power supplies. By changing the source temperatures the evaporation rates can be controlled to produce KP compounds of different stoichiometries.

Further evaporation sources may be added to provide dopants, for example, an independently heated and controlled source of the $Al_2O_3$ crucible type heated by a tantalum wire basket may be utilized to evaporate nickel wire, heated to a temperature just below its melting point. This system has been used to provide nickel doped $KP_{15}$ films.

The single phosphorus boat has been utilized to provide amorphous red pure phosphorus films.

Films of phosphorus and polyphosphides have been provided on gallium phosphide, gallium arsenide, indium phosphide, glass, and metallized glass substrates, metallized with nickel and titanium.

We believe our process employing the cracker 34 just below the substrates 28 may be utilized with outer phosphorus sources than the heated baffle boat 24. For example, phosphine could be admitted to the system which would be reacted at the cracker 34 to provide the $P_2$ species employed. We believe this would be the best way to utilize phosphine as a phosphorus source, however phosphine could also be introduced without the use of the cracker 34 to react with the potassium at the substrates 28 and glow discharge could be employed to activate this reactive evaporation.

We have employed a thermal cracker according to our invention in molecular beam epitaxy between the exit end of the baffle or collimator and the substrates and have produced fine quality films of polyphosphides and of a new amorphous form of phosphorus having a layer-like, puckered sheet-like, structure.

OBJECTS OF THE INVENTION

It is therefore an object of the invention to provide high vacuum deposited films of catenated phosphorus material.

Another object of the invention is to provide passivating and insulating films on III–V materials.

A further object of the invention is to provide pure phosphorus thin films by high vacuum deposition.

A still further object of the invention is to provide such films on a variety of substrates.

Still another object of the invention is to provide semiconductor and electro-optical devices, optical films, and coatings.

A yet further object of the invention is to provide improved high vacuum deposition apparatus and methods using vacuum deposition and molecular beam epitaxy.

Yet another object of the invention is to provide such apparatus and methods for the production of film of pnictides, particularly phosphorus.

Other objects of the invention will in part be obvious and will in part appear elsewhere in this application.

The invention accordingly comprises several steps and the relation of one or more of such steps with respect to each of the others, the apparatus embodying the features of construction and arrangement of parts which are adapted to effect such steps, and the articles possessing the features, properties and relation of elements which are exemplified in this application. The scope of the invention is indicated in the claims.

BRIEF DESCRIPTION OF THE DRAWINGS

For a fuller understanding of the nature and objects of the invention reference should be made to the following detailed description taken in conjunction with the accompanying drawings in which.

The same reference numbers refer to the same elements throughout the several views of the drawings.

BEST MODE FOR CARRYING OUT THE INVENTION

Vacuum Evaporation

EXAMPLE 1

Figure 1:
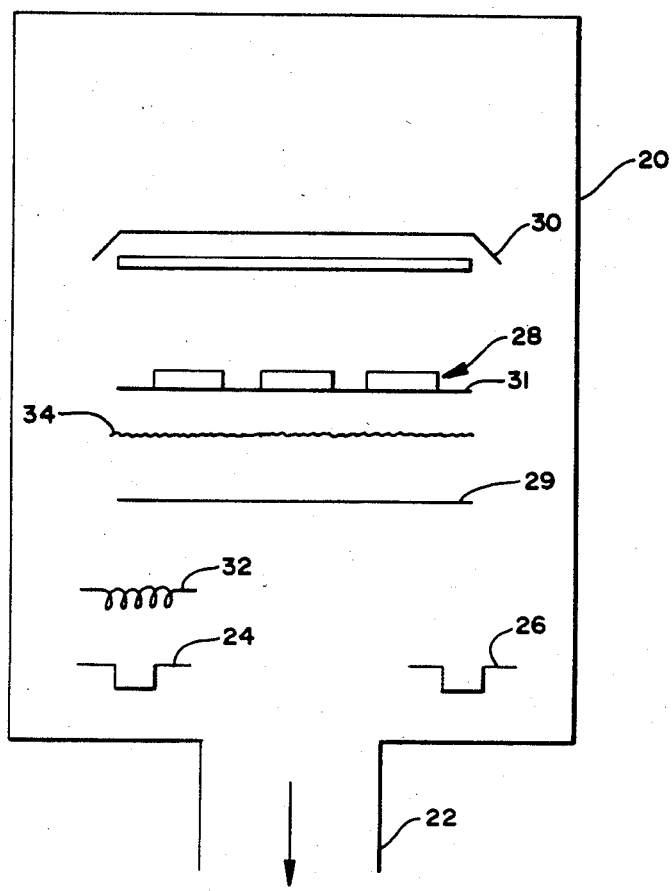
FIG. 1 is a schematic diagram of vacuum evaporation apparatus according to the invention.

Referring to FIG. 1, a Cooke high vacuum evaporator 20, Model CVE 301, was diffusion pumped through outlet 22 to a base pressure of less than $1 \times 10^{-6}$ torr. Two baffle boat sources for co-evaporation obtained from R. D. Mathis were used, one 24 containing powdered red phosphorus, the other 26 containing granular $KC_8$, a graphite intercalation compound. The sources were independently, resistively heated and the temperature monitored by thermocouples. The substrates 28 were approximately 6" above the sources and shielded by a movable shutter 29. A quartz radiant heater 30 was used to bring the substrate temperature to 275°-285° C. The substrates were glass, metallized glass (metallized with Ni and Ti) and GaP, GaAs, InP.

Two high temperature tungsten "crackers" were used to convert the evaporating $P_4$ species to $P_2$. One is a coiled filament 32 directly above the exit of the P source; the other was a straight wire 34 1" below the substrates. Both wires are resistively heated to above 1000° C.

The phosphorus source 24 is heated until a constant pressure of $8-9 \times 10^{-4}$ torr is reached, as measured by a vacuum ionization gauge in the chamber 20. The $KC_8$ source 26 is heated to 275°-295° C. When both the $KC_8$ temperature and chamber pressure are stabilized, the shutter 29 is moved to allow deposition of the film. A three-hour deposition under these conditions will deposit approximately 1 micron of $KP_{15}$ as determined by x-ray fluorescence and Raman spectroscopy.

EXAMPLE 2

An identical experimental apparatus and procedure as was used in Example 1 with the addition of a third evaporation source. This, independently heated and controlled source is of the $Al_2O_3$ crucible type heated by a Ta wire basket. The evaporant material was Ni wire which was held at a temperature just below its melting point of 1453° C. A two-hour deposition yields 1.3 to 1.6 micron films of 0.2% Ni doped $KP_{15}$ films as determined by X-ray fluorescence, Raman spectroscopy and ESCA.

EXAMPLE 3

An identical experimental apparatus and procedure as Example 1 but with a substrate temperature of 275°–300° C., a $KC_8$ source temperature of 255°–275° C. and a chamber pressure of $1\times10^{-3}$ torr. The films resulting from a three-hour deposition are extremely smooth and shiny. The film thickness is 1.5–2.0 microns and the composition ranges from $KP_{40}$ to greater than $KP_{100}$. Thus stoichiometry can be controlled by the relative evaporation rates of the sources and thus by the temperatures of the sources.

EXAMPLE 4

An identical experimental apparatus and procedure as in Example 1 but without a $KC_8$ source. A two-hour deposition, at a pressure of $9\times10^{-4}$ torr, with a 285° C. substrate temperature yielded smooth, shiny red films 0.5 to 1.5 microns thick with an optical band edge at 2.0 eV. These films are amorphous by Raman spectroscopy. These films have been deposited on glass, metalized glass (Ni and Ti) and GaP, GaAs, InP. They have a high resistivity of greater than $10^{10}$ (ohm-cm) and a breakdown voltage in the order of $10^5$ volts per centimeter. They may therefore be used as the insulating or passivating layers in devices formed on III–V semiconductors as disclosed in the above-identified applications of Diego Olego, David G. Brock, John A. Baumann, and William E. Spicer, entitled MIS Devices Employing Elemental Pnictide Or Polyphosphide Insulating Layers, and the application filed herewith, entitled PASSIVATION AND INSULATION OF III–V DEVICES WITH PNICTIDES, PARTICULARLY AMORPHOUS PNICTIDES HAVING A LAYER-LIKE STRUCTURE, Ser. No. 581,115, filed Feb. 17, 1985. These applications are incorporated herein by reference.

The graphite intercalation compounds used as a source of potassium in Examples 1 and 2 are disclosed in the copending application of Gary K. Miller, John A. Baumann, David G. Brock, and Mark A. Kuck, entitled Graphite Intercalated Alkali Metal Vapor Sources, Ser. No. 509,157, filed June 29, 1983. Said application is incorporated herein by reference.

Molecular Beam Epitaxy

Figure 2:
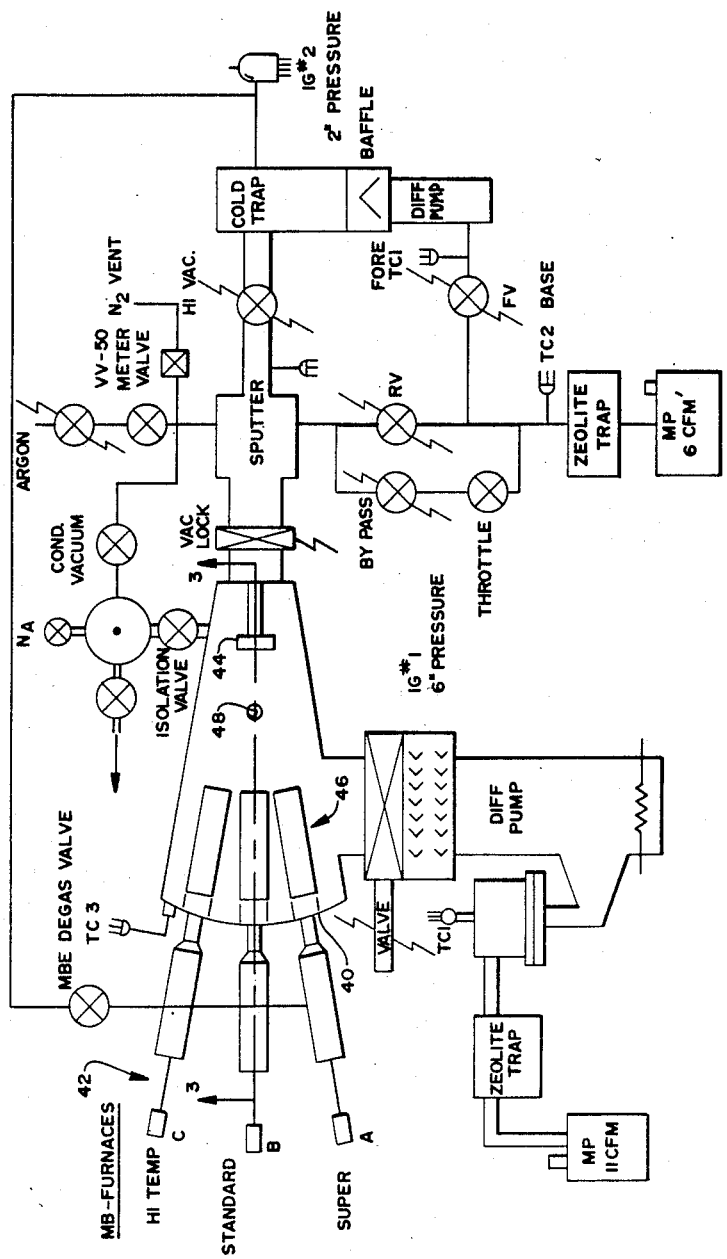
FIG. 2 is a schematic plan view of molecular beam apparatus according to the invention.

Molecular beam apparatus employing the thermal cracker of the invention is shown schematically in FIG. 2. The system illustrated is a Vactronics, Inc. molecular beam epitaxy system Model 6000S. It comprises a vacuum chamber 40, molecular beam furnaces generally indicated at 42, a target support 44, molecular beam water-cooled baffles or collimators 46, and an electrically heated filament 48 which acts as the thermal cracker. Various vacuum system apparatuses are shown schematically connected to the vacuum chamber 40.

Figure 3:
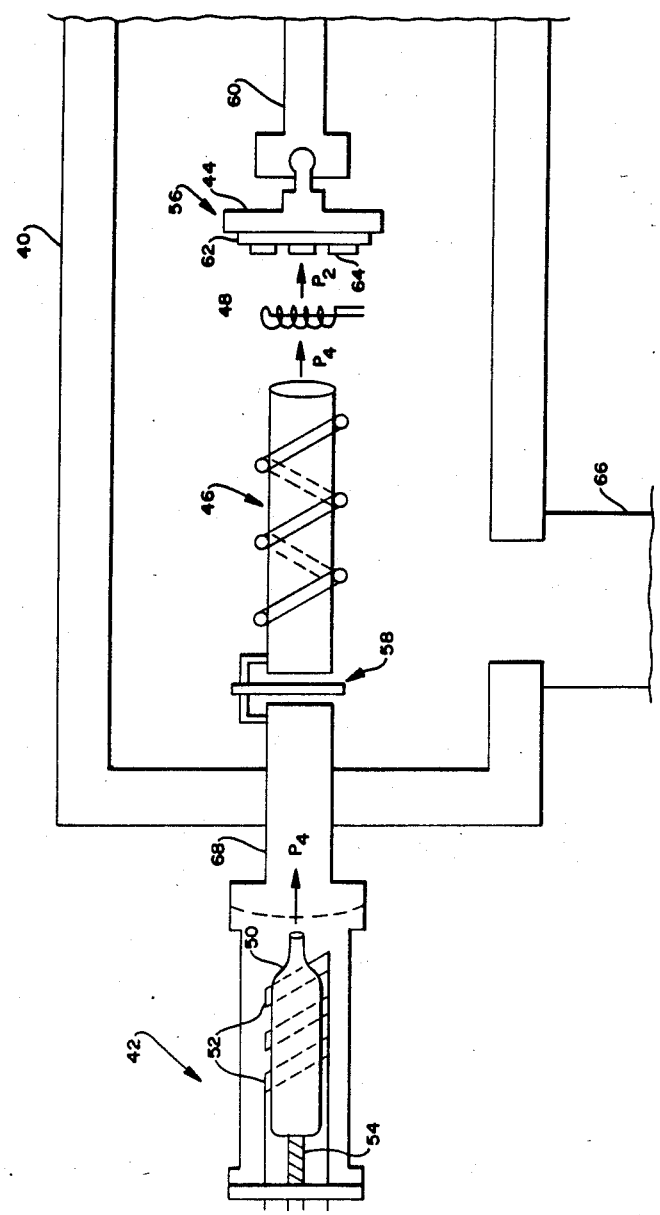
FIG. 3 is a partial schematic cross sectional view taken along the line 3—3 of FIG. 2.

More specifically, referring to FIG. 3, a molecular beam furnace that comprises a Knudsen cell 50, is electrically heated by a resistance heater 52. The Knudsen cell is contacted by a thermocouple 54 so that the temperature may be controlled. For depositing phosphorus the Knudsen cell 50 contains red phosphorus and the phosphorus exits the Knudsen cell as shown by the arrow as $P_4$ species. Those molecules which are not directed at the target, generally indicated at 56, condense on the wall of the water-cooled baffle, generally indicated at 46. The beam may be turned on and off by means of a shutter, generally indicated at 58. The $P_4$ species exiting the collimator 46 is cracked by the heated filament 48 to $P_2$ species which proceeds to the target 56.

The target comprises target holder 44 and support 60. The target may comprise, for example, a glass substrate 62 with III–V crystals 64 mounted thereon. The entire apparatus is drawn to high vacuum through the exit port 66.

Preparation of Insulating Films of Amorphous Phosphorus by Molecular Beam Epitaxy The Vactronics, Inc. molecular beam epitaxy system, Model 6000S shown in FIG. 1, was diffussion pumped to a base pressure less than $5\times10^{-7}$ Torr. A resistively-heated Knudsen cell gun 42 mounted on a CON-FLAT port 68 on the vacuum chamber was axially aligned with a target substrate holder. The gun port was about 55 cm from the substrate holder. A water-cooled cylindrical baffle 46 about 30 cm long was used to help collimate the evaporant beam from the gun. A shutter 58 was positioned between the port and the baffle. Substrates 64 were InP or GaAs crystals mounted on a Corning 7059 glass plate 62 with silver paint. The molecular beam epitaxy gun 42, which was initially loaded with about 40 grams of red phosphorus (99.9999% purity), was taken to about 200° C. A pressure of $1\times10^{-5}$ Torr was measured by an ionization gauge located at the top of the pumping stack.

A coiled filament 48 mounted between the baffle 46 exit and the substrates 64 (about 20 cm from the latter) was resistively heated to temperatures above 1000° C.

The heated filament 48 is used to thermally crack the $P_4$ evaporant species to $P_2$. A deposition time of 100 minutes, terminated by shutting off the filament 48, resulted in a 400 Å thick film.

Several of these phosphorus films, ranging in thickness between 400 Å and 2500 Å, and deposited at rates between 4 and 26 Å/min. were evaluated for their intrinsic electro-optical properties. Their performance in MIS device configurations were equal to or better than those observed earlier for the films prepared by vacuum evaporation.

From the electrical characterization, the density of surface states at the phosphorus—InP interface has been estimated to be about $10^{-10}$ cm$^{-2}$ eV$^{-1}$.

While we have disclosed the use of phosphorus in our apparatuses and methods it is contemplated that other pnictides such as arsenic, antimony, and bismuth, or combinations thereof, may also be deposited or co-deposited as films using these same apparatuses and methods.

While we have disclosed using red phosphorus heated in a furnace or boat as the source of Pnictide$_4$ species in our vacuum evaporation and molecular beam apparatus, a controlled leak of Pnictide$_4$ carried by an inert gas supplied by a pnictide bubbler may also be employed to provide for better control and continuous operation. For disclosure of this apparatus reference should be had to the above-identified applications filed herewith, particularly those entitled CONTINUOUS PNICTIDE SOURCE AND DELIVERY SYSTEM FOR FILM DEPOSITION, PARTICULARLY BY CHEMICAL VAPOR DEPOSITION, Ser. No. 581,102, filed Feb. 17, 1984; and HIGH VACUUM DEPOSITION PROCESSES EMPLOYING A CONTINUOUS PNICTIDE DELIVERY SYSTEM, Ser. No. 581,104, filed Feb. 17, 1984; which applications are incorporated herein by reference.

It will thus be seen that the objects set forth above, among those made apparent from the preceding description, are efficiently obtained and, since certain changes may be made in carrying out the above methods and in the apparatus set forth without departing from the scope of the invention, it is intended that all matter contained in the above description or shown in the accompanying drawing, shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Particularly, it is to be understood that in the claims, ingredients and compounds recited in the singular are intended to include compatible mixtures of such ingredients wherever the sense permits.

Having described our invention what we claim as new and desire to secure by Letters Patent is:

1. The method of forming an evaporated film comprising a pnictide including the steps of supplying a continuous source of Pnictide$_4$ vapor species, cracking said vapor species into Pnictide$_2$ molecules, preventing the recombination of said Pnictide$_2$ molecules, and depositing said Pnictide$_2$ molecules as a film on said substrate.

2. Vacuum evaporating a film of an alkali metal polypnictide onto a substrate from a first heated source containing an alkali metal intercalated in another material and a second source containing a pnictide.

3. Vacuum evaporating a film of an alkali metal polynictide onto a substrate in the presence of a cracker from a first heated source containing an alkali metal intercalated in another material and a second source containing a pnictide.

4. The method in claims 2 or 3, wherein said pnictide is formed into a collimated molecular beam before being deposited.

5. The method in claims 2 or 3, wherein said film consists essentially of phosphorus.

6. The method of forming an evaporated film comprising a pnictide, said method including the steps of providing a source of pnictide vapor species and depositing such a film onto a substrate in the presence of at least two crackers, one of said crackers being positioned above said source of pnictide vapor species to crack said pnictide vapor species, the other of said crackers being positioned below said substrate to prevent recombination of said cracked pnictide vapor species.

7. The method of claim 6 wherein said two crackers are positioned in a vapor stream of said pnictide vapor species between said source and said substrate.

8. The method of claims 6 or 7 wherein said crackers include two high temperature tungsten filaments.

9. The method of claim 6 wherein said pnictide vapor species is P$_4$.

10. The method of claim 9 wherein said crackers crack said P$_4$ into P$_2$ and prevent reformation of P$_4$ molecules.

11. The method of claims 2 or 3 wherein said first source is an alkali metal graphite intercalate.

12. The method of claim 11 wherein said alkali metal graphite intercalate is KC$_8$.

13. The method of claim 6 including the step of heating said one of said crackers to a temperature of 1000° C. or above.

14. The method of claim 6 further including the step of heating each of said crackers to a temperature of 1000° C. or above.

* * * * *